United States Patent
McClure

(10) Patent No.: US 6,347,381 B1
(45) Date of Patent: Feb. 12, 2002

(54) TEST MODE CIRCUITRY FOR ELECTRONIC STORAGE DEVICES AND THE LIKE

(75) Inventor: David C. McClure, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/183,491

(22) Filed: Oct. 30, 1998

(51) Int. Cl.[7] .................................................. G06F 11/30
(52) U.S. Cl. ......................................... 714/30; 714/721
(58) Field of Search ............................. 714/30, 32, 36, 714/39, 42, 47, 54, 5, 718, 733, 734; 368/201

(56) References Cited

U.S. PATENT DOCUMENTS

| | | | | |
|---|---|---|---|---|
| 5,500,824 A | * | 3/1996 | Fink | 365/201 |
| 5,651,011 A | * | 7/1997 | Keeth | 371/22.1 |
| 5,745,499 A | * | 4/1998 | Ong | 371/21.4 |
| 5,771,188 A | * | 6/1998 | Fink | 365/149 |
| 5,793,685 A | * | 8/1998 | Suma | 365/201 |
| 5,841,714 A | * | 11/1998 | Sher et al. | 365/201 |
| 5,848,010 A | * | 12/1998 | Sher | 365/201 |
| 5,914,968 A | * | 6/1999 | Keeth | 371/21.4 |
| 5,933,378 A | * | 8/1999 | Gans et al. | 365/201 |
| 5,944,845 A | * | 8/1999 | Miller, Jr. | 714/724 |
| 5,949,725 A | * | 9/1999 | Sher | 365/201 |
| 6,009,029 A | * | 12/1999 | Sher | 365/201 |
| 6,138,258 A | * | 10/2000 | Miller, Jr. | 714/724 |

* cited by examiner

*Primary Examiner*—Nadeem Iqbal
(74) *Attorney, Agent, or Firm*—Lisa K. Jorgenson; Andre Szuwalski

(57) ABSTRACT

A detection circuit and a test mode circuit incorporating the detection circuit is disclosed. The detection circuit includes an N-channel transistor having a first source, a first gate, and a first drain, wherein the first drain is connected to a supply voltage. The detection circuit also includes a P-channel transistor having a second source, a second gate, and a second drain, wherein the second source is connected to the first source and the second drain provides an output signal indicative of a supervoltage being applied to the first gate. The test mode circuit also includes a memory access cycle time-out feature override circuit.

46 Claims, 4 Drawing Sheets

FIG. 3
(PRIOR ART)

| TRIP VOLTAGE AT INPUT PIN 12 | | |
|---|---|---|
|  | VCC = 4.5V | VCC = 5.5V |
| T = 0°C | 6.9V | 7.4V |
| T = 80°C | 4.8V | 5.3V |

FIG. 4

| TRIP VOLTAGE AT INPUT PIN 102 WITHOUT BODY EFFECT | | |
|---|---|---|
|  | VCC = 4.5V | VCC = 5.5V |
| T = 0°C | 6.07V | 6.98V |
| T = 80°C | 5.37V | 6.34V |

FIG. 5

| TRIP VOLTAGE AT INPUT PIN 102 WITH BODY EFFECT | | |
|---|---|---|
|  | VCC = 4.5V | VCC = 5.5V |
| T = 0°C | 6.91V | 7.86V |
| T = 80°C | 5.71V | 6.72V |

TEST MODE CIRCUITRY FOR ELECTRONIC STORAGE DEVICES AND THE LIKE

FIELD OF THE INVENTION

The present invention relates generally to storage devices and, more particularly, to test mode circuitry for electronic storage devices and the like.

BACKGROUND OF THE INVENTION

An electronic storage device, such as a static random access memory (SRAM) device, is typically a monolithic device having both control and memory array circuitry. The control circuitry typically includes circuitry for testing the electronic storage device after it has been manufactured. Such test circuitry typically places the electronic storage device into a test mode wherein the different functions of the electronic storage device can be tested over a wide range of predetermined measurement conditions.

The test circuitry typically places the electronic storage device into the test mode whenever a high voltage, or supervoltage, is applied to one of the input pins of the electronic storage device. For example, the supervoltage can be applied to an input pin that is used as an address pin or a control pin during normal operation. The test circuitry detects the supervoltage on the input pin and places the electronic storage device into the test mode.

The test circuitry typically contains a high voltage detection circuit for detecting the supervoltage on the input pin. For example, referring to FIG. 1, there is shown a prior art high voltage detection circuit 10 for detecting a supervoltage on an input pin 12. The high voltage detection circuit 10 includes a diode stack 14, a weak load transistor (i.e., a transistor that is biased and/or dimensioned so as to conduct only a relatively small amount of current) 16, and a series of inverters 18. If no supervoltage is applied to input pin 12, the diodes in the diode stack 14 typically cannot become forward biased and the weak load transistor 16 maintains node N1 in a low state. The signal at node N1 is then buffered through the series of inverters 18 so as to cause the output signal HVOUT to be in an inactive low state. However, if a supervoltage is applied to input pin 12, the diodes in the diode stack 14 can become forward biased and node N1 can be brought to a high state. The signal at node N1 is then buffered through the series of inverters 18 so as to cause the output signal HVOUT to be brought to an active high state. When the output signal HVOUT is active high, the rest of the test circuitry (not shown) places the electronic storage device into the test mode.

There are problems associated with the above-described high voltage detection circuit 10. For example, because input pin 12 is connected to a source/drain junction of the diode stack 14, pin leakage can become an issue and the source/drain junction can become forward biased. Also, the numerous diodes in the diode stack 14 are very process sensitive. Thus, accidental entry into or exit from the test mode is possible at some process corners. In fact, this is even likely since, as previously indicated, the electronic storage device is tested over a wide range of predetermined measurement conditions. Further, a current path can exist on some process/voltage corners for the supply voltage. That is, at high VCC (hot temperature) and a minimum transistor threshold corner, node N1 may not be at ground and the transistors in the first inverter in the series of inverters 18 may have some crowbar current. Additionally, the entire circuit is latch-up sensitive due to the range of voltages over which node N1 can reside.

In addition to the above-stated problems, the electronic storage device may not be thoroughly, or at least efficiently, tested due to limitations in the test circuitry. For example, during a typical burn-in test mode, the electronic storage device is placed on a burn-in board and placed in a burn-in oven so that infant-life failures can be detected. During such a burn-in test mode, the electronic storage device will typically enter into an idle state if no activity is detected on the input pins of the electronic storage device after a predetermined period of time (e.g., 30 nanoseconds). This time-out feature is typically beneficially provided to minimize the power consumption of the electronic storage device, and the test circuitry typically has no effect on this time-out feature. That is, the time-out feature typically becomes active regardless of whether the electronic storage device is in burn-in, or any other type of, test mode. However, most test rigs have cycle times on the order of 2000–3000 nanoseconds due to processing limitations and noise considerations, among other things. Thus, the electronic storage device can only be tested for a small percentage of the test rig cycle time (e.g., for $30/3000$, or $1/100$ of the test rig cycle time). Consequently, the electronic storage device may not be thoroughly, or at least efficiently, tested due to limitations in the test circuitry.

In view of the foregoing, it would be desirable to provide test mode circuitry which overcomes the above-stated problems. More particularly, it would be desirable to provide test mode circuitry having a reliable high voltage detection circuit and/or a time-out feature disable circuit for allowing electronic storage, or other, devices to be tested in a more thorough and efficient manner.

SUMMARY OF THE INVENTION

According to the present invention, test mode circuitry for electronic storage devices and the like is provided. In a first embodiment, the test mode circuitry includes a detection circuit for detecting a supervoltage on an input connection of an electronic storage device or the like. The detection circuit includes an N-channel transistor having a first source, a first gate, and a first drain, wherein the first gate is connected to the input connection and the first drain is connected to a supply voltage. The detection circuit also includes a P-channel transistor having a second source, a second gate, and a second drain, wherein the second source is connected to the first source and the second gate is connected to a biasing circuit. The biasing circuit can include, for example, a pull-up circuit connected between the second gate and the supply voltage, and a weak load connected between the second gate and ground. The pull-up circuit can be, for example, a P-channel transistor having a gate and drain that are connected to the second gate. The weak load can be, for example, an N-channel transistor having a drain that is connected to the second gate. The second drain provides an output signal for the detection circuit that is indicative of the supervoltage being applied to the input connection.

In accordance with another aspect of the present invention, the detection circuit can include a switching circuit connected to the second gate for biasing the second gate. The switching circuit can be, for example, a P-channel transistor having a drain that is connected to the second gate.

In accordance with a further aspect of the present invention, the detection circuit can include a weak load connected to the second drain for regulating the value of the output signal. The weak load can be, for example, an N-channel transistor having a drain that is connected to the second drain.

In accordance with a still further aspect of the present invention, the detection circuit can include a noise filtering circuit connected to the second drain for filtering the output signal. The noise filtering circuit can be, for example, a schmitt trigger.

In accordance with a still further aspect of the present invention, the N-channel transistor has a substrate, and the substrate can be beneficially connected to the first source or to ground so as to avoid or introduce a body effect, respectively, in the detection circuit.

In accordance with a still further aspect of the present invention, the supervoltage has a first voltage value, the supply voltage has a second voltage value, and the first voltage value is greater than the second voltage value.

In a second embodiment, the test mode circuitry includes a test mode circuit for an electronic storage device having a memory access cycle time-out feature. The test mode circuit incorporates a detection circuit, such as the one described above, and a memory access cycle time-out feature override circuit. The detection circuit detects a supervoltage on an input connection of the electronic storage device and generates an active test mode signal in response thereto. The memory access time-out feature override circuit is responsive to the active test mode signal and overrides the memory access cycle time-out feature and generates an active memory block select signal for substantially all of a memory access cycle of the electronic storage device. The memory access cycle time-out feature override circuit typically includes a long cycle enable circuit that is responsive to the active test mode signal and generates a long cycle enable signal in response thereto. The memory access cycle time-out feature override circuit typically also includes a memory block reset control circuit that is responsive to the long cycle enable signal and generates a memory block reset control signal in response thereto. The memory access cycle time-out feature override circuit typically further includes a memory block select circuit that is responsive to the memory block reset control signal and generates the active memory block select signal in response thereto.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 3 is a table showing the trip voltages for the prior art high voltage detection circuit of FIG. 1.

FIG. 4 is a table showing the trip voltages, without body effect, for the high voltage detection circuit of FIG. 2A.

FIG. 5 is a table showing the trip voltages, with body effect, for the high voltage detection circuit of FIG. 2A.

DETAILED DESCRIPTION OF A PREFERRED EMBODIMENT

Figure 2A:
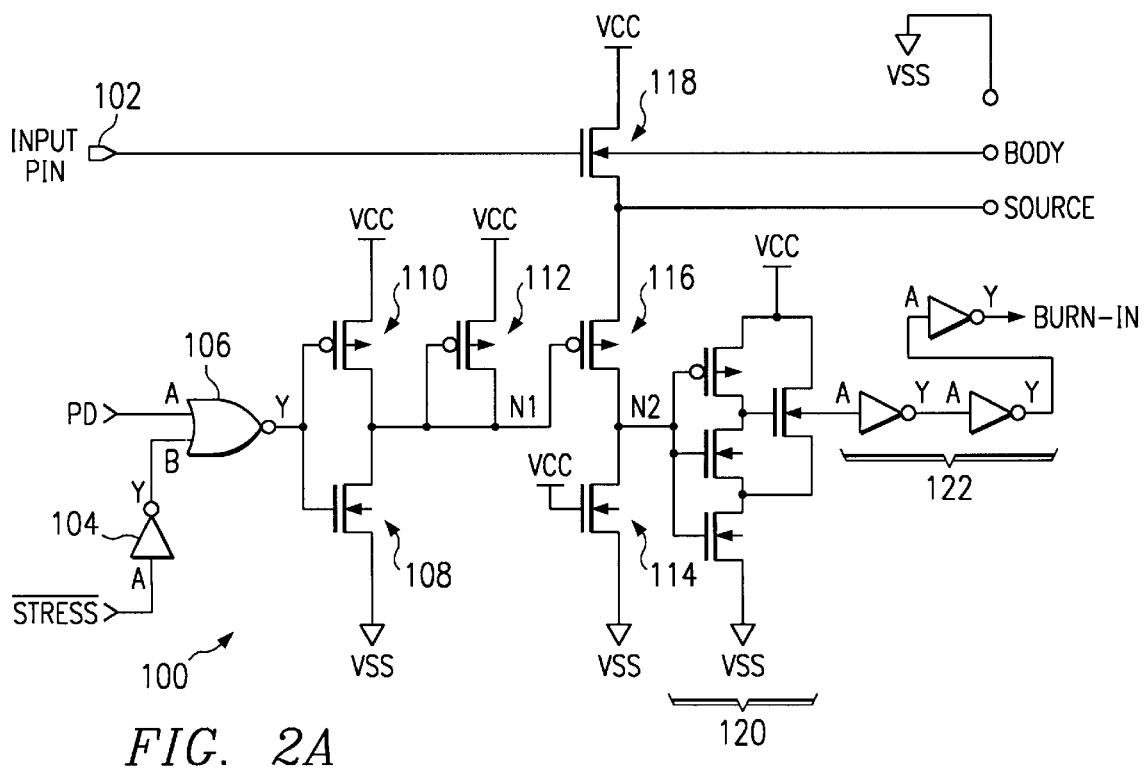
FIG. 2A is a schematic diagram of a high voltage detection circuit for detecting a supervoltage on an input connection in accordance with the present invention.

Referring to FIG. 2A, there is shown a schematic diagram of a high voltage detection circuit 100 for detecting a supervoltage on an input pin 102 in accordance with the present invention. The high voltage detection circuit 100 includes a first inverter 104, a NOR gate 106, a first weak load N-channel transistor (i.e., a transistor that is biased and/or dimensioned so as to conduct only a relatively small amount of current) 108, a first P-channel transistor 110, a second P-channel transistor 112, a second weak load N-channel transistor 114, a third P-channel transistor 116, a body tapped N-channel transistor 118, a schmitt trigger 120, and a series of inverters 122. For purposes of this detailed description, the high voltage detection circuit 100 is designed to be functional for a burn-in test mode.

During the burn-in test mode, a power down (PD) input signal is typically in an inactive low state and a stress ($\overline{STRESS}$) input signal is typically in an inactive high state. The state of the PD input signal indicates the level of the supply voltage (VCC). That is, when the supply voltage is above a predetermined minimum operating voltage level (e.g., 4.5 volts), the PD input signal is in an inactive low state. The state of the $\overline{STRESS}$ input signal indicates whether or not a stress mode is active. That is, when the device which incorporates the high voltage detection circuit 100 is not in a stress mode (i.e., a programmable stress test mode), the $\overline{STRESS}$ input signal is in an inactive high state. As described in detail below, the body connection (BODY) to the body tapped N-channel transistor 118 is tied to either the source connection (SOURCE) to the body tapped N-channel transistor 118, or to VSS.

When the PD input signal is in the inactive low state and the $\overline{STRESS}$ input signal is in the inactive high state, the logic of the first inverter 104 and the NOR gate 106 cause the first P-channel transistor 110 to be off and the first weak load N-channel transistor 108 to be on as a very weak load. At the same time, the second P-channel transistor 112, which acts as a P-channel diode, pulls up node N1 such that it is biased at VCC−$V_{TP}$. For the third P-channel transistor 116 to conduct, the source connection (SOURCE) to the body tapped N-channel transistor 118 must be at VCC or above. For this to occur, the input pin 102 must be at least VCC+$V_{TN}$. Thus, the input pin 102 must be at a supervoltage (e.g., VCC+$V_{TN}$) for node N2 to go high. It should be noted that the second weak load N-channel transistor 114 is always on as a weak load.

If the input pin 102 is not at a supervoltage (i.e., at least VCC+$V_{TN}$), then the third P-channel transistor 116 cannot conduct and the second weak load N-channel transistor 114 causes node N2 to assume a low state. The low state signal at node N2 is passed through the schmitt trigger 120, which provides noise immunity with hysteresis, and then buffered by the series of inverters 122 so as to cause a burn-in (BURN-IN) output signal to be brought to an inactive low state. However, if a supervoltage (i.e., at least VCC+$V_{TN}$) is applied to the input pin 102, then the third P-channel transistor 116 can conduct and node N2 assumes a high state. The high state signal at node N2 is passed through the schmitt trigger 120 and then buffered by the series of inverters 122 so as to cause the BURN-IN output signal to be brought to an active high state. In either case, the BURN-IN output signal is forwarded to the rest of the test circuitry (see FIGS. 2B–2D below), which controls the state of the burn-in test mode based upon the state of the BURN-IN output signal, as described in detail below.

At this point it should be noted that when the PD input signal is in the active high state or the $\overline{\text{STRESS}}$ input signal is in the active low state, the logic of the first inverter 104 and the NOR gate 106 cause the first P-channel transistor 110 to be on, the first weak load N-channel transistor 108 to be off, and node N1 to be at VCC. Since the source connection (SOURCE) to the body tapped N-channel transistor 118 can never be above VCC, the third P-channel transistor 116 will be off and node N2 will be at VSS. In this state, the high voltage detection circuit 100 consumes no DC current and the test mode cannot be entered.

The value of $V_{TN}$ can be effected by what is tied to the body connection (BODY) (i.e., the substrate) to the body tapped N-channel transistor 118. That is, no body effect is realized if the body connection (BODY) to the body tapped N-channel transistor 118 is tied to the source connection (SOURCE) to the body tapped N-channel transistor 118. However, a body effect can be realized if the body connection (BODY) to the body tapped N-channel transistor 118 is tied to VSS.

Figure 1:
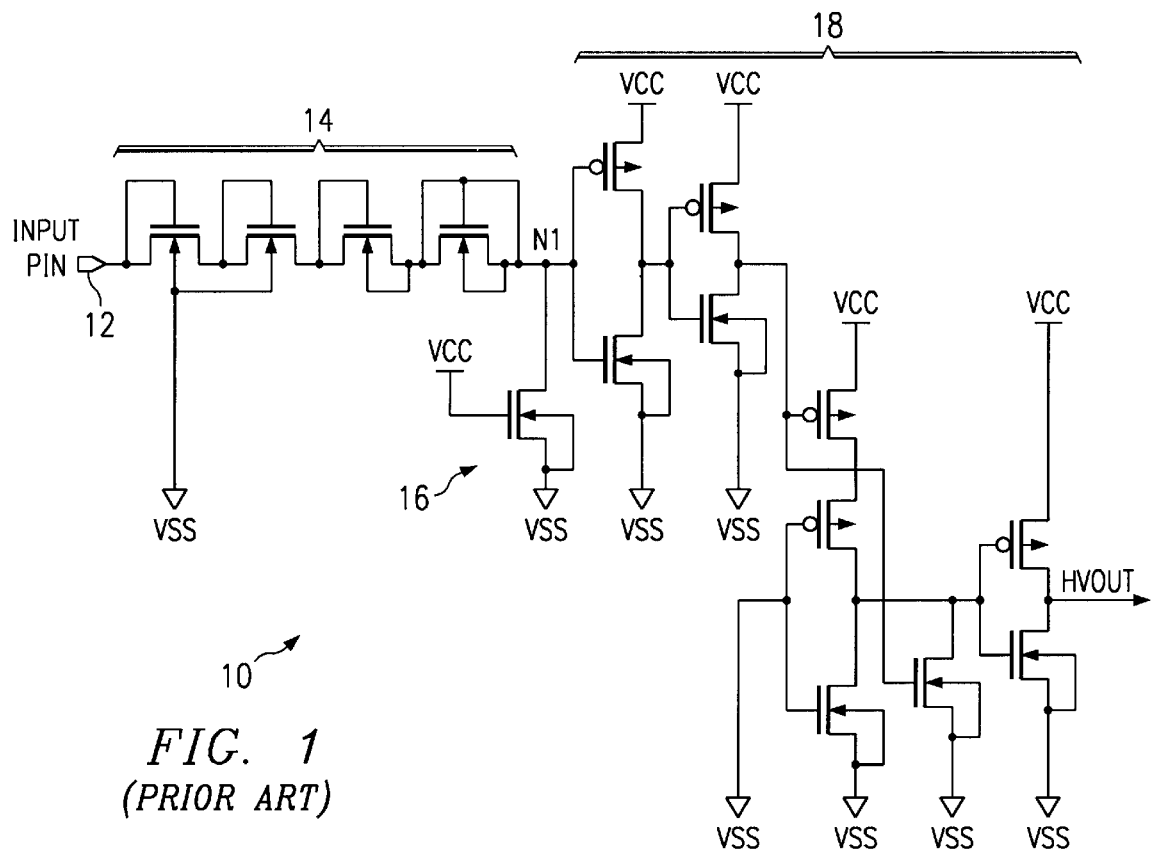
FIG. 1 (previously described) is a schematic diagram of a prior art high voltage detection circuit for detecting a supervoltage on an input pin.

Referring to FIGS. 3, 4, and 5, there are shown simulation result tables indicating the trip voltages required at input pin 12 (prior art FIG. 1), at input pin 102 (FIG. 2A) without body effect, and at input pin 102 (FIG. 2A) with body effect, respectively, over various operating conditions. In FIG. 3, it can be seen that the trip voltage at input pin 12 is 5.3 volts when VCC=5.5 volts and T=80 degrees C. This would allow test mode entry at a trip voltage below VCC, which is unacceptable. Also, the trip voltage at input pin 12 varies by about 2.1 volts over the 80 degree C temperature variation, and by about 0.4 volts over the 1.0 volt variation in VCC. In contrast, FIG. 4 shows that the trip voltage at input pin 102 varies by only about 0.7 volts over the 80 degree C temperature variation, and by about 1.0 volts over the 1.0 volt variation in VCC, which is desirable since most devices do not allow for input levels greater than VCC+0.3 volts. Further improvement is seen in FIG. 5, which shows that the trip voltage at input pin 102 varies by about 1.2 volts over the 80 degree C temperature variation, and by about 1.0 volts over the 1.0 volt variation in VCC. It can also be seen that the body effect provides an overall increase in the trip voltage level.

In view of the foregoing, it is apparent that the high voltage detection circuit 100 provides improved operation over process corners and operating corners (temperature and voltage). It also prevents pin leakage, accidental test mode entry, and reduced latch-up sensitivity.

As previously indicated, the state of the BURN-IN output signal determines the state of the burn-in test mode. When the BURN-IN output signal is in an inactive low state, the burn-in test mode cannot be entered. However, when the BURN-IN output signal is in an active high state, the burn-in test mode can be entered. Furthermore, in accordance with the present invention, when the BURN-IN output signal is in an active high state, the time-out feature of the device incorporating the test circuitry is disabled.

Figure 2B:
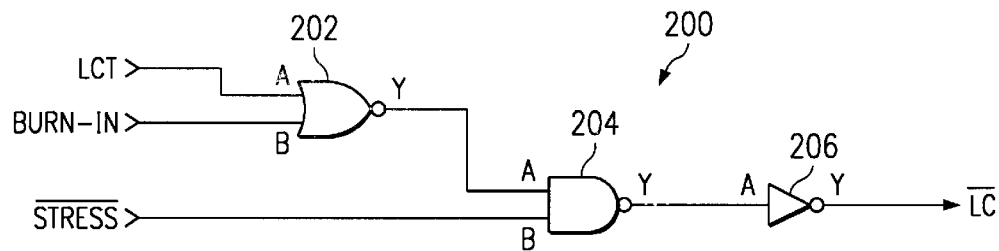
FIG. 2B is a schematic diagram of a long cycle enable circuit for disabling a time-out feature in accordance with the present invention.

Referring to FIG. 2B, there is shown a long cycle enable circuit 200 for disabling the time-out feature of the device incorporating the test circuitry. The long cycle enable circuit 200 includes a NOR gate 202, a NAND gate 204, and an inverter 206. The BURN-IN signal from the high voltage detection circuit 100 is applied to one input of NOR gate 202. A long cycle test (LCT) input signal is applied to the other input of NOR gate 202. The LCT input signal indicates the state of a programmable long cycle test bit in the device incorporating the test circuitry. The LCT input signal is typically in an inactive low state, indicating that the long cycle test bit is not set. The output of NOR gate 202 is applied to one input of NAND gate 204, and the $\overline{\text{STRESS}}$ input signal is applied to the other input of NAND gate 204. As previously indicated, the $\overline{\text{STRESS}}$ input signal is typically in an inactive low state.

The long cycle enable circuit 200 is operative to cause a long cycle ($\overline{\text{LC}}$) output signal to be brought to an active low state whenever any of the input signals are active. In the context of the burn-in test mode, the $\overline{\text{LC}}$ output signal is brought to an active low state whenever the BURN-IN signal from the high voltage detection circuit 100 is in an active high state. That is, when the LCT input signal is in an inactive low state and the $\overline{\text{STRESS}}$ input signal is in an inactive high state, the $\overline{\text{LC}}$ output signal is in an active low state whenever the BURN-IN signal from the high voltage detection circuit 100 is in an active high state. Conversely, when the LCT input signal is in an inactive low state and the $\overline{\text{STRESS}}$ input signal is in an inactive high state, the $\overline{\text{LC}}$ output signal is in an inactive high state whenever the BURN-IN signal from the high voltage detection circuit 100 is in an inactive low state.

Figure 2D:
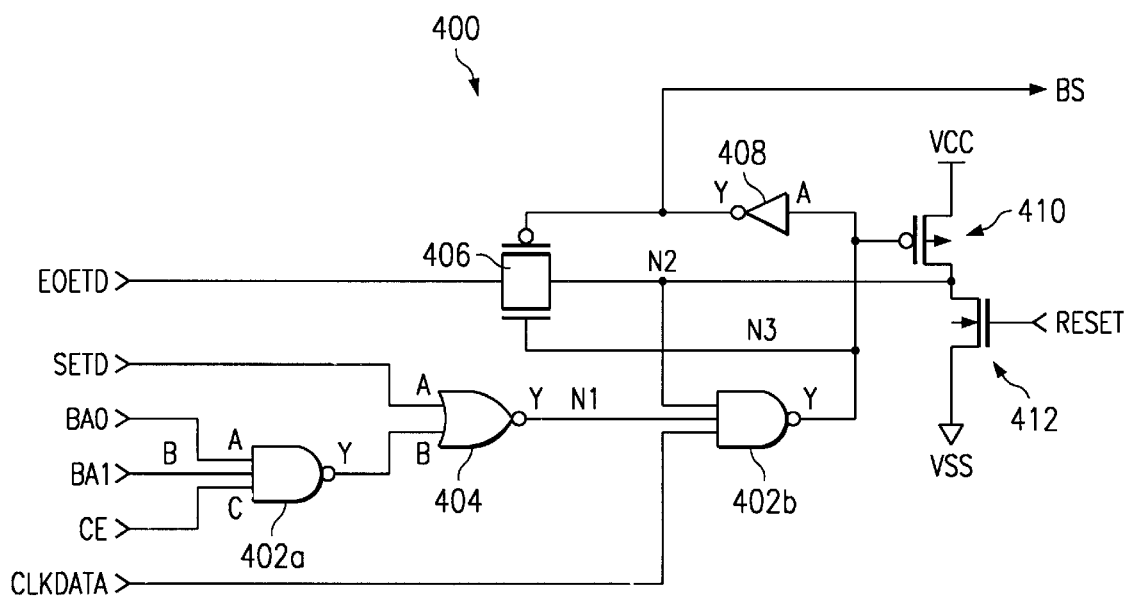
FIG. 2D is a schematic diagram of a block select circuit for controlling memory block selection in accordance with the present invention.
Figure 2C:
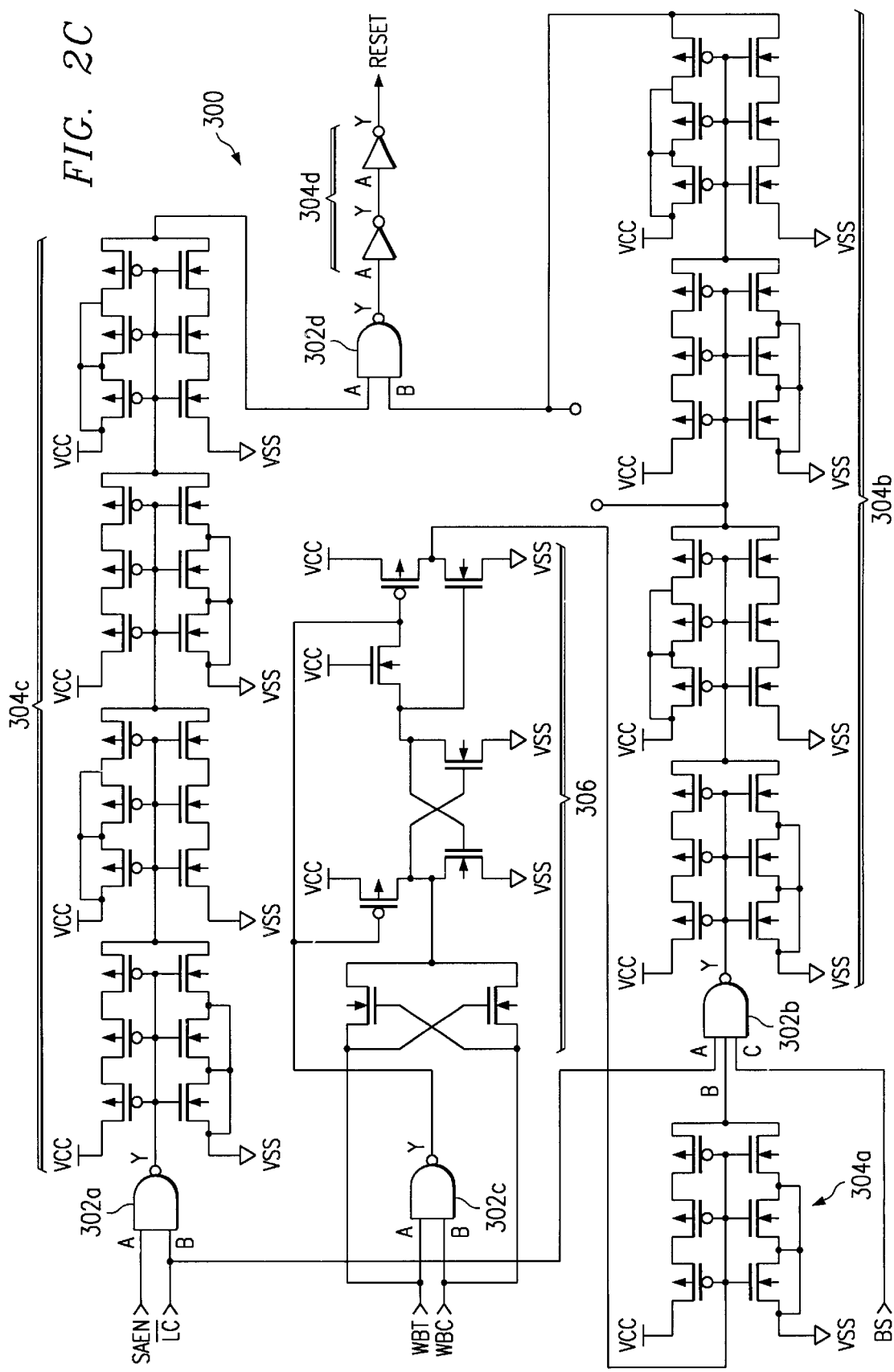
FIG. 2C is a schematic diagram of a memory block reset control circuit for controlling when a memory block times out in accordance with the present invention.

Referring to FIG. 2C, there is shown a memory block reset control circuit 300 for controlling when a memory block times out in the device incorporating the test circuitry. The memory block reset control circuit 300 includes a plurality of NAND gates 302, a plurality of inverters 304, and write sequence tracking circuit 306. The $\overline{\text{LC}}$ signal from the long cycle enable circuit 200 is applied to one input of NAND gate 302a and to one input of NAND gate 302b. A sense amplifier enable (SAEN) input signal is applied to the other input of NAND gate 302a. The SAEN input signal indicates the state of a voltage sense amplifier circuit (not shown) in the device incorporating the test circuitry. The SAEN input signal is typically in an active high state, indicating that the supply voltage level (i.e., VCC) is within a predetermined operating range. A block select (BS) input signal and an inverted output of the write sequence tracking circuit 306 are applied to the other inputs of NAND gate 302b. The BS input signal indicates the state of a block select circuit (see FIG. 2D), as described in detail below. The inverted output of the write sequence tracking circuit 306, which has write bus true (WBT) and write bus complement (WBC) as input signals, mimics the write time to a memory cell.

The memory block reset control circuit 300 is operative to cause a reset (RESET) output signal to remain at an inactive low state whenever the $\overline{\text{LC}}$ signal from the long cycle enable circuit 200 is active low. That is, whenever the $\overline{\text{LC}}$ signal from the long cycle enable circuit 200 is active low, the RESET output signal is in an inactive low state. The inactive low state of the RESET output signal can be more readily understood with reference to FIG. 2D.

Referring to FIG. 2D, there is shown a block select circuit 400 for controlling memory block selection in the device incorporating the test circuitry. The block select circuit 400 includes a pair of NAND gates 402, a NOR gate 404, a transmission gate 406, an inverter 408, a P-channel transistor 410, and an N-channel transistor 412. A memory block address bit 0 (BA0) input signal, a memory block address bit 1 (BA1) input signal, and a chip enable (CE) input signal are all applied to the inputs of NAND gate 402a. The BA0 and BA1 input signals are just the upper order memory block address signals, and the CE input signal is the overall device chip enable signal. These signals are active whenever a memory access cycle is occurring. The output of NAND gate 402a is connected to one input of NOR gate 404. A summation edge transition detection (SETD) input signal is applied to the other input of NOR gate 404. The SETD input signal is active high if there is any activity on the input pins (e.g., the address and data pins) of the device incorporating the test circuitry. The output of NOR gate 404 is connected to one input of NAND gate 402b. A data clock (CLKDATA) input signal is applied to another input of NAND gate 402b. The CLKDATA input signal is active high whenever a memory access cycle is occurring. Somewhat related to the SETD input signal, an end of edge transition detection (EOETD) input signal, which is applied to the input of transmission gate 406, provides an active high pulse when activity has ceased on the input pins (e.g., the address and data pins) of the device incorporating the test circuitry. The output of transmission gate 406 is connected to the third input of NAND gate 402b.

In operation, whenever a memory block is being selected, node N1 is high, the CLKDATA input signal is high, and the EOETD input signal provides an active high pulse. The EOETD active high input signal pulse passes through transmission gate 406, which causes the output of NAND gate 402b to go low and transmission gate 406 to turn off, thereby latching node N2 in a high state. Since the output of NAND gate 402b (e.g., node N3) is low, the BS output signal is high and the memory block is selected. If the RESET signal from the memory block reset control circuit 300 is in a low state, node N2 remains latched in a high state and the memory block stays selected (i.e., BS stays high). Only when the SETD input signal transitions high, signifying the start of the next memory access cycle, will the memory block become deselected. That is, when the SETD input signal goes high, node N1 goes low and node N3 goes high, thereby turning on transmission gate 406, which causes node N2 to go low since the EOETD input signal will now be low. Since node N3 is now high, the BS output signal will be low, which turns off the memory block for a few nanoseconds (while the SETD input signal is high) to allow equalization of bit lines, etc. and to prepare for a new memory access cycle.

In view of the foregoing, it is apparent that the test circuitry allows for a device to remain active for an entire memory access cycle. Thus, burn-in time can be greatly reduced or maintained with a resultant much lower FIT (failure-in-time) rate. In most cases, burn-in can be approximately 100 times more efficient.

It should be noted that the input pin 102 also typically functions as an active low output enable pin. Consequently, when the input pin 102 is high (i.e., at a supervoltage) during test mode, the device outputs will typically be at tristate. This is not a problem, however, since burn-in only performs write cycles. If desired, the BURN-IN signal could gate outputs to go low-Z state if there is a need to do so.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. A detection circuit for detecting a supervoltage relative to a supply voltage, the detection circuit comprising:
    an N-channel transistor having a first source, a first gate, and a first drain, wherein the first drain is connected to the supply voltage; and
    a P-channel transistor having a second source, a second gate, and a second drain, wherein the second source is connected to the first source and the second drain provides an output signal indicative of the supervoltage being applied to the first gate;
    wherein the supervoltage has a first voltage value, the supply voltage has a second voltage value, and the first voltage value is greater than the second voltage value.

2. The detection circuit as defined in claim 1, further comprising:
    a biasing circuit connected to the second gate for biasing the second gate.

3. The detection circuit as defined in claim 2, wherein the biasing circuit includes:
    a pull-up circuit connected between the second gate and the supply voltage; and
    a load circuit connected between the second gate and ground.

4. The detection circuit as defined in claim 3, wherein the P-channel transistor has a threshold voltage having a first voltage value, wherein the supply voltage has a second voltage value, wherein the pull-up circuit and the load circuit bias the second gate at a bias voltage having a third voltage value, wherein the third voltage value is less than or equal to the second voltage value minus the first voltage value.

5. The detection circuit as defined in claim 1, further comprising:
    a switching circuit connected to the second gate for biasing the second gate.

6. The detection circuit as defined in claim 5, wherein the switching circuit is connected between the second gate and the supply voltage.

7. The detection circuit as defined in claim 6, wherein the P-channel transistor has a threshold voltage having a first voltage value, wherein the supply voltage has a second voltage value, wherein the switching circuit biases the second gate at a bias voltage having a third voltage value, wherein the third voltage value is greater than the second voltage value minus the first voltage value.

8. A detection circuit for detecting a supervoltage relative to a supply voltage, the detection circuit, comprising:
    an N-channel transistor having a first source, a first gate, and a first drain, wherein the first drain is connected to the supply voltage;
    a P-channel transistor having a second source, a second gate, and a second drain, wherein the second source is connected to the first source and the second drain provides an output signal indicative of the supervoltage being applied to the first gate; and
    a load circuit connected to the second drain for regulating the value of the output signal.

9. A detection circuit for detecting a supervoltage relative to a supply voltage, the detection circuit, comprising:
    an N-channel transistor having a first source, a first gate, and a first drain, wherein the first drain is connected to the supply voltage;
    a P-channel transistor having a second source, a second gate, and a second drain, wherein the second source is connected to the first source and the second drain provides an output signal indicative of the supervoltage being applied to the first gate; and
    a filtering circuit connected to the second drain for filtering the output signal.

10. The detection circuit as defined in claim 9, wherein the filtering circuit is a schmitt trigger circuit.

11. The detection circuit as defined in claim 1, wherein the N-channel transistor has a substrate, wherein the substrate is connected to the first source so as to avoid a body effect in the detection circuit.

12. The detection circuit as defined in claim 1, wherein the N-channel transistor has a substrate, wherein the substrate is connected to ground so as to introduce a body effect in the detection circuit.

13. A test mode circuit for an electronic storage device having a memory access cycle time-out feature, the test mode circuit comprising:
    a detection circuit for detecting a supervoltage on an input connection of the electronic storage device and for generating an active test mode signal in response thereto; and
    a memory access cycle time-out feature override circuit, responsive to the active test mode signal, for overriding the memory access cycle time-out feature and for generating an active memory block select signal for substantially all of a memory access cycle of the electronic storage device.

14. The test mode circuit as defined in claim 10, wherein the detection circuit comprises:
    an N-channel transistor having a first source, a first gate, and a first drain, wherein the first gate is connected to the input connection and the first drain is connected to a supply voltage; and
    a P-channel transistor having a second source, a second gate, and a second drain, wherein the second source is connected to the first source and the second drain provides an output signal indicative of the supervoltage being applied to the input connection.

15. The test mode circuit as defined in claim 14, wherein the detection circuit further comprises:
    a biasing circuit connected to the second gate for biasing the second gate.

16. The test mode circuit as defined in claim 15, wherein biasing circuit includes:
    a pull-up circuit connected between the second gate and the supply voltage; and
    a load circuit connected between the second gate and ground.

17. The test mode circuit as defined in claim 16, wherein the P-channel transistor has a threshold voltage having a first voltage value, wherein the supply voltage has a second voltage value, wherein the pull-up circuit and the load circuit bias the second gate at a bias voltage having a third voltage value, wherein the third voltage value is less than or equal to the second voltage value minus the first voltage value.

18. The test mode circuit as defined in claim 14, wherein the detection circuit further comprises:
    a switching circuit connected to the second gate for biasing the second gate.

19. The test mode circuit as defined in claim 18, wherein the switching circuit is connected between the second gate and the supply voltage.

20. The test mode circuit as defined in claim 19, wherein the P-channel transistor has a threshold voltage having a first voltage value, wherein the supply voltage has a second voltage value, wherein the switching circuit biases the second gate at a bias voltage having a third voltage value, wherein the third voltage value is greater than the second voltage value minus the first voltage value.

21. The test mode circuit as defined in claim 14, wherein the detection circuit further comprises:
    a load circuit connected to the second drain for regulating the value of the output signal.

22. The test mode circuit as defined in claim 14, wherein the detection circuit further comprises:
    a filtering circuit connected to the second drain for filtering the output signal.

23. The test mode circuit as defined in claim 22, wherein the filtering circuit is a schmitt trigger.

24. The test mode circuit as defined in claim 14, wherein the N-channel transistor has a substrate, wherein the substrate is connected to the first source so as to avoid a body effect in the detection circuit.

25. The test mode circuit as defined in claim 14, wherein the N-channel transistor has a substrate, wherein the substrate is connected to ground so as to introduce a body effect in the detection circuit.

26. The test mode circuit as defined in claim 14, wherein the supervoltage has a first voltage value, the supply voltage has a second voltage value, and the first voltage value is greater than the second voltage value.

27. The test mode circuit as defined in claim 14, wherein the active test mode signal is representative of the output signal.

28. The test mode circuit as defined in claim 13, wherein the memory access cycle time-out feature override circuit includes a long cycle enable circuit, responsive to the active test mode signal, for generating an active long cycle enable signal.

29. The test mode circuit as defined in claim 28, wherein the memory access cycle time-out feature override circuit further includes a memory block reset control circuit, responsive to the active long cycle enable signal, for generating an active memory block reset control signal.

30. The test mode circuit as defined in claim 29, wherein the memory access cycle time-out feature override circuit further includes a memory block select circuit, responsive to the active memory block reset control signal, for generating the active memory block select signal.

31. A method for testing a memory access cycle of an electronic storage device, the method comprising the steps of:
    detecting a supervoltage on an input connection of the electronic storage device;
    generating an active test mode signal based upon the detected supervoltage;
    generating an active memory block reset control signal based upon the detected supervoltage; and
    generating an active memory block select signal for substantially all of the memory access cycle of the electronic storage device based upon the detected supervoltage, comprising generating the active memory block select signal based upon the active memory block reset control signal.

32. The detection circuit of claim 1, wherein:
    the second drain provides an output signal indicative of the supervoltage applied to the first gate being greater than approximately a threshold voltage of the N-channel transistor above the supply voltage.

33. The detection circuit of claim 1, further comprising:
    control circuitry for normally maintaining the second gate at a voltage level approximately a threshold voltage level below the supply voltage.

34. The detection circuit of claim 1, further comprising:
    a load coupled to the second drain.

35. A detection circuit for detecting a supervoltage relative to a supply voltage, the detection circuit comprising:
    a first transistor having a first drain/source terminal, a control terminal, and a second drain/source terminal, wherein the first drain/source terminal is coupled to the supply voltage; and a second transistor having a first drain/source terminal, a control terminal, and a second drain/source terminal, wherein the first drain/source terminal of the second transistor is coupled to the second drain/source terminal of the first transistor and the second source/drain terminal of the second transistor provides an output signal indicative of a supervoltage applied to the control terminal of the first transistor being greater than the supply voltage.

36. The detection circuit of claim 35, wherein:

the second drain/source terminal of the second transistor provides an output signal indicative of the supervoltage applied to the control terminal of the first transistor being greater than approximately a threshold voltage of the first transistor above the supply voltage.

37. The detection circuit of claim 36, further comprising:

a schmitt trigger circuit coupled to the second drain/source terminal of the second transistor.

38. The detection circuit of claim 35, further comprising:

control circuitry for normally maintaining the control terminal of the second transistor at approximately a threshold voltage level below the supply voltage.

39. The detection circuit of claim 35, wherein:

the first transistor comprises an n-channel MOS transistor; and the second transistor comprises a p-channel MOS transistor.

40. The detection circuit of claim 35, further comprising:

a load device coupled to the second drain/source terminal of the second transistor.

41. The detection circuit of claim 35, wherein:

the first transistor is formed over a substrate of semiconductor material, the substrate being coupled to the ground potential.

42. The detection circuit of claim 35, wherein:

the first transistor is formed over a substrate of semiconductor material, the substrate being coupled to the second drain/source terminal of the first transistor.

43. A method of testing a memory device having a memory access cycle time-out feature, comprising:

detecting a voltage appearing on an input connection of the memory device being at least a voltage level greater than a supply voltage level;

entering a test mode in response to detecting the voltage;

overriding the memory access cycle time-out feature during the time the memory device is in the test mode; and performing one or more test operations on the memory device during the time the memory device is in the test mode.

44. The method of claim 43, wherein:

the voltage level is approximately a threshold voltage of a transistor.

45. The method of claim 44, wherein:

the voltage level is approximately a threshold voltage of a transistor experiencing a body effect.

46. The method of claim 43, wherein the step of overriding comprises asynchronously disabling a cycle reset signal during the time the memory device is in the test mode.

* * * * *